(12) United States Patent
Hanlon

(10) Patent No.: US 7,443,674 B1
(45) Date of Patent: Oct. 28, 2008

(54) RACK ENCLOSURE COOLING SYSTEM

(76) Inventor: Thomas Hanlon, 23960 Via De Gema Linda, Murrieta, CA (US) 92562-2013

( * ) Notice: Subject to any disclaimer, the term of this patent is extended or adjusted under 35 U.S.C. 154(b) by 0 days.

(21) Appl. No.: 11/767,912

(22) Filed: Jun. 25, 2007

(51) Int. Cl.
*H05K 7/20* (2006.01)

(52) U.S. Cl. .......... 361/695; 361/694; 454/184

(58) Field of Classification Search ........ 361/687, 361/694–695; 454/184
See application file for complete search history.

(56) References Cited

U.S. PATENT DOCUMENTS

| | | | | |
|---|---|---|---|---|
| 5,718,628 | A * | 2/1998 | Nakazato et al. | 454/184 |
| 6,151,210 | A * | 11/2000 | Cercioglu et al. | 361/690 |
| 6,628,250 | B1 * | 9/2003 | Yoo et al. | 345/60 |
| 6,659,661 | B2 * | 12/2003 | Deguchi et al. | 396/611 |
| 6,904,968 | B2 * | 6/2005 | Beitelmal et al. | 165/247 |
| 7,074,123 | B2 * | 7/2006 | Bettridge et al. | 454/184 |
| 7,182,208 | B2 * | 2/2007 | Tachibana | 211/26 |
| 7,365,977 | B2 * | 4/2008 | Fujiya et al. | 361/695 |
| 7,379,299 | B2 * | 5/2008 | Walsh et al. | 361/695 |
| 2004/0112582 | A1 * | 6/2004 | Beitelmal et al. | 165/247 |
| 2005/0170770 | A1 * | 8/2005 | Johnson et al. | 454/184 |
| 2005/0237716 | A1 * | 10/2005 | Chu et al. | 361/696 |

* cited by examiner

*Primary Examiner*—Gregory D Thompson
(74) *Attorney, Agent, or Firm*—Frank G. Morkunas

(57) ABSTRACT

A rack panel, rack enclosure, and system for cooling electronic components which are vertically mounted in a rack enclosure wherein the system has a front panel with two hollow internal ducts separated by an inner screen-like wall for more evenly distributing and delivering virtually equal amounts of cold air to each component with the rack enclosure. An air inlet, with one or more air movers adjacent thereto, introduces cold air into the front panel, evenly circulates it through the two ducts, and delivers it to the electronic components. A temperature sensor on the exhaust vents of the rear panel of the rack enclosure sensing the temperature of the cold air as it is discharged from the rack enclosure to ensure a continued sustainable degree of cold air is maintained throughout the rack enclosure.

23 Claims, 2 Drawing Sheets

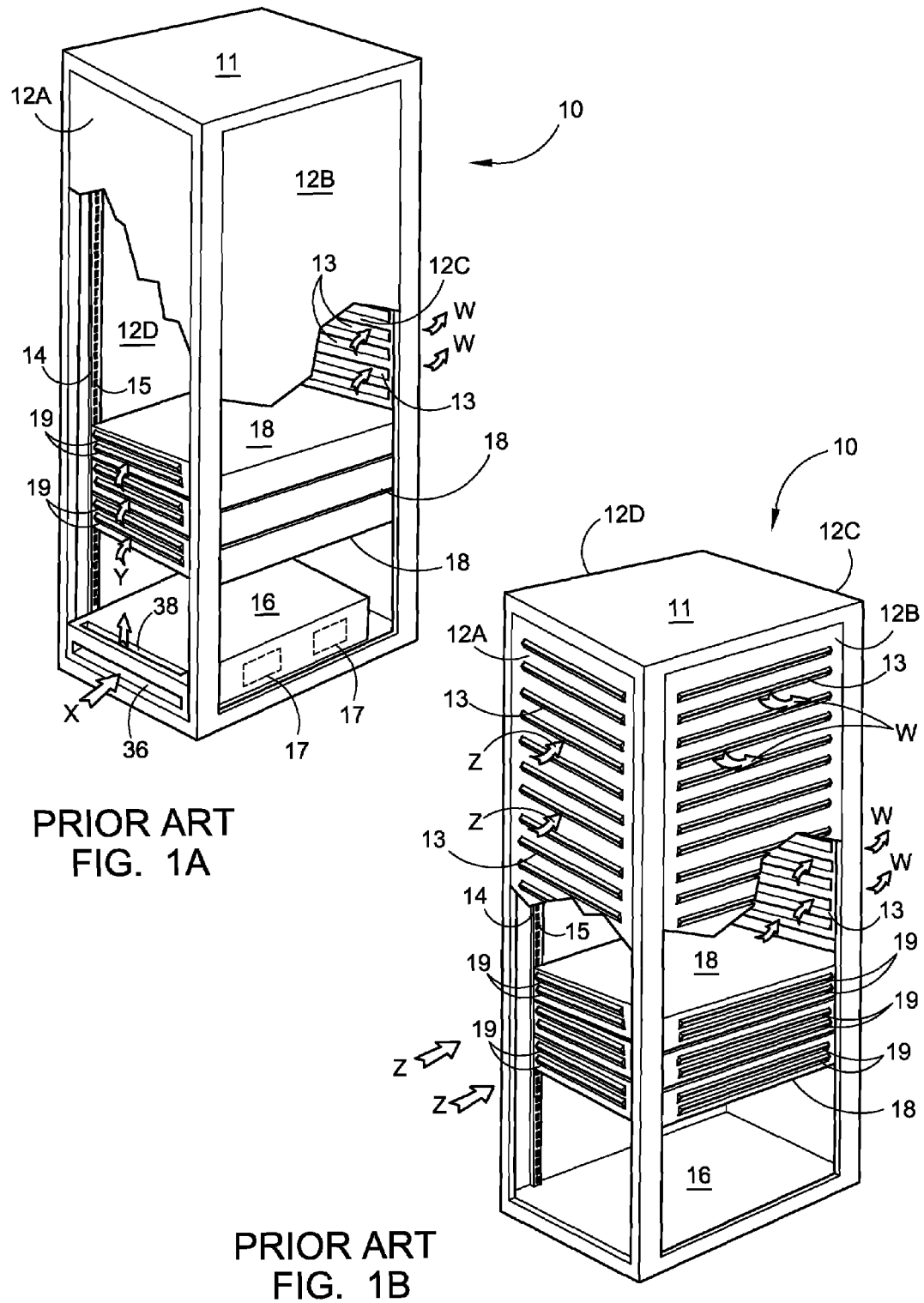
PRIOR ART
FIG. 1A
PRIOR ART
FIG. 1B

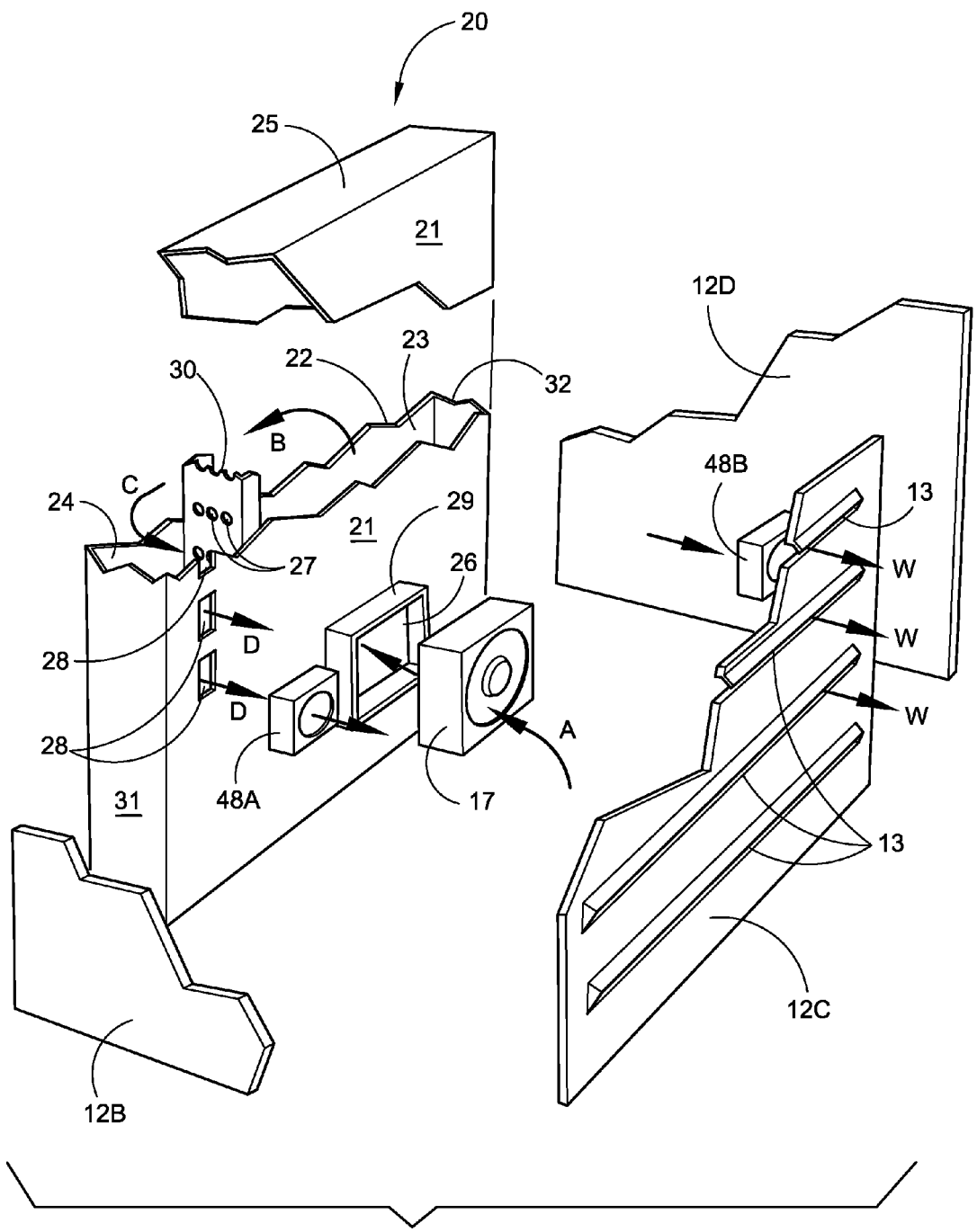
FIG. 2

RACK ENCLOSURE COOLING SYSTEM

CROSS REFERENCES TO RELATED APPLICATIONS

This application claims the benefit of U.S. Provisional application Ser. No. 11/426,353, filed on Jun. 26, 2006.

STATEMENT REGARDING FEDERALLY-SPONSORED RESEARCH OR DEVELOPMENT

None.

BACKGROUND

The rack panel of this disclosure generally relates to a novel panel for rack enclosures and a more efficient and effective method to cool the rack-mounted equipment inside the rack enclosures and to a method to more uniformly deliver large volumetric flows of cool air to cool a tall-standing rack enclosure containing such electronic equipment such as servers.

Most electronic equipment, particularly servers, is commonly arranged on racks and stacked vertically within the rack enclosure. These racks or enclosures meet industry standards for form and fit. As the equipment [servers] is on and operating, which commonly is 24 hours per day, seven days a week, they generate heat. The more servers, the greater the heat. Heat will build up and cause a slow down to the function of the equipment or a breakdown. Consequently, to maintain high degrees of efficiency and continued operation, the equipment within must be cooled.

To cool the equipment inside the rack enclosure, the electronic equipment within is usually designed to draw air from the same side, the front of the rack enclosure. Further, more than one rack enclosure is in a room. Generally the rack enclosures, with electronic equipment within, may be located in a special room where the fully equipped rack enclosure is on a raised floor with a sub-floor under the raised floor. The space between the sub-floor and the raised floor has ample space for power and data and communications cables, and generally has cold air circulating laterally throughout that space. In some applications, the cold air from that space is introduced in proximity to the front of the rack enclosures to cool the electronic equipment.

As electronic equipment becomes more and more powerful and faster and faster in operation, it becomes hotter and hotter. It is therefore necessary to introduce larger amounts of cold air from the space between the sub-floor and the raised floor in order to better cool the electronic equipment. For rack enclosures designed to industry standards [such as the EIA-310, the IEC 60297, and the Din 41494 and SC48D] there is limited space within the rack enclosure to accommodate larger flows of cold air which are necessary to properly cool the electronic equipment.

In theory, this is overcome by using high velocity air, but this air moves so fast through small ducts that it cannot be delivered evenly to the electronic equipment. A better rack enclosure component and method were needed to more efficiently and effectively move the large quantities of cold air necessary for proper cooling of the electronic equipment from the space between the sub-floor and the raised floor to the inlet surface of electronic equipment within the rack enclosure and to distribute that air more evenly throughout the entire rack enclosure and thereby, more evenly to and through the electronic equipment.

This novel panel of the present disclosure for use with current rack enclosures and the method incorporated thereby is intended to fulfill the need to more evenly introduce of large amounts of sub-ambient [cold] air to the surfaces of the rack enclosure and particularly to the electronic equipment within.

The foregoing has outlined some of the more pertinent objects of the rack panel of this disclosure. These objects should be construed to be merely illustrative of some of the more prominent features and applications of the rack panel of this disclosure. Many other beneficial results can be attained by applying the disclosed rack panel of this disclosure in a different manner or by modifying the rack panel of this disclosure within the scope of the disclosure. Accordingly, other objects and a fuller understanding of the rack panel of this disclosure may be had by referring to the summary of the rack panel of this disclosure and the detailed description of the preferred embodiment in addition to the scope of the rack panel of this disclosure defined by the claims taken in conjunction with the accompanying drawings.

SUMMARY

The above-noted problems, among others, are overcome by the rack panel of this disclosure. Briefly stated, the rack panel of this disclosure contemplates a system for cooling electronic components vertically mounted in a rack enclosure wherein the system has a front panel with two hollow internal ducts separated by an inner screen-like wall for more evenly distributing and delivering virtually equal amounts of cold air to each component with the rack enclosure.

An air inlet, with one or more air movers adjacent thereto which is at or near to the bottom or the top of the front panel, introduces cold air into the front panel and evenly circulates it through the two ducts and delivers it to the electronic components through a plurality of discharge outlets. A temperature sensor is at the air inlet to measure the temperature of incoming cold air and one or more similar sensors are on the exhaust side panel or exhaust vents of the rear panel of the rack enclosure to sense and measure the temperature of the hot exhaust air that was heated by the electronic components and is discharged from the rack enclosure to ensure that a continued sustainable volume of cold air is delivered to the rack enclosure by adjusting the fan speed.

The rack panel of the present disclosure may be used as a replacement to the front panel of a rack enclosure or to the two side panels of a rack enclosure or on all three sides if desired.

The foregoing has outlined the more pertinent and important features of the rack panel of this disclosure in order that the detailed description that follows may be better understood so the present contributions to the art may be more fully appreciated. Additional features of the rack panel of this disclosure will be described hereinafter which form the subject of the claims. It should be appreciated by those skilled in the art that the conception and the disclosed specific embodiment may be readily utilized as a basis for modifying or designing other structures and methods for carrying out the same purposes of the rack panel of this disclosure. It also should be realized by those skilled in the art that such equivalent constructions and methods do not depart from the spirit and scope of the rack panel of this disclosure as set forth in the appended claims.

BRIEF DESCRIPTION OF THE DRAWINGS

For a fuller understanding of the nature and objects of the rack panel of this disclosure, reference should be had to the following detailed description taken in conjunction with the accompanying drawings in which:

FIGS. 1A and 1B are perspective detailed views of a prior art rack enclosure and panels.

FIG. 2 is a cut-away detailed view of a preferred embodiment of the rack panel of the present disclosure.

DETAILED DESCRIPTION

Referring now to the drawings in detail and in particular to FIGS. 1A, 1B, and 2, FIGS. 1A and 1B illustrate typical prior-art rack enclosures 10. The rack enclosure 10 has four side panels 12A-D and a top 11. In these examples panel 12A is the front and panel 12C is the rear. The side panels 12A-D may have vents 13 or may be solid. FIG. 1A illustrates a rack enclosure 10 wherein only the rear panel 12C has exhaust vents 13 and the other panels 12A, 12B, and 12D are basically solid. FIG. 1B illustrates a rack enclosure 10 which has vents on all four side panels 12A-12D.

Inside the rack enclosure 10 are brackets 14 with slots 15 which support the electronic components 18 within. These are conventional brackets 14 using conventional means in which to adjust height and in which to hold and support the electronic component 18. Space is important as it is the goal to vertically insert in the rack enclosure 10 as many electronic components 18 as is possible. Consequently, the electronic components 18 are virtually stacked atop one another.

Typically the electronic components 18 have slits or vents 19 on the inlet side [that side facing the front panel 12A] and on the exhaust side [that side facing the rear panel 12C, electronic component 18 vents not shown]. The space between the inlet side vents 19 and the front panel 12A generally is very small. In some cases, the electronic components 18 have vents 19 on all sides as illustrated in FIG. 1B [electronic component rear vent not shown].

FIG. 1A is a typical prior art configuration of a rack enclosure 10 with exhaust vents 13 only on the rear panel 12C. In this situation, cold air is introduced into the rack enclosure 10 at the front [panel 12A] of the rack enclosure 10 and generally from below. One or more air movers or fans 17, arranged in parallel relationship at the bottom of the rack enclosure 10, pulls the cold air into the rack enclosure 10 in the direction of Arrow X through inlet port 36 and up through its exhaust/outlet port 38. The fans 17 are typically housed in an enclosure 16 on the bottom of the rack enclosure 10.

In this prior-art configuration, the cold air enters the room from the sub-floor rises and settles to the floor above the sub-floor. The cold air is then drawn into the interior through outlet port 38 the direction of Arrow Y and, due to the internal fans inside the electronic components 18, the cold air then enters the front vents 19 on the electronic components 18, passes through the electronic components 18, out the rear vents 19 of the electronic components 18, and passes out of the rack enclosure 10 in the direction of Arrow W through the rear panel 12C of the rack enclosure 10 through its vents 13 [not shown] on that rear panel 12C.

Generally in this type configuration, the electronic components 18 only have vents 19 on the front and rear but may also have similar vents 19 on the sides. As described above the space between the inlet vents 19 of the electronic components 18 is quite small and, consequently, a sustained and sufficient volume of cold air necessary to cool the electronic components 18 cannot be achieved.

Another prior-art configuration is illustrated in FIG. 1B. This means of cooling provides for vents 13 on all the panels 12A-D or typically only on the front panel 12A and the rear panel 12C, the latter being more effective than the former. In the more typical configuration of vents 13 only on the front and rear panels 12A, 12C, respectively, room ambient air is drawn into the rack enclosure 10 in the direction of Arrow Z and into the vents 19 of the electronic components 18 by the internal fans of those electronic components 18. As the ambient air passes through the electronic components 18, it is heated after which the now heated air passes out the rear vents 19 of the electronic components 18, and ultimately out the exhaust vents 13 [not shown] on the rear panel 12C.

Generally, room ambient air does not effectively cool the many electronic components 18 in these rack-enclosed systems in that they generate large heat loads and typically require large volumetric flows of cold air to be properly cooled. As explained above, in all prior art devices and methods, there is limited space to deliver the required large volumes of cold air where specifically needed. Consequently, either an insufficient volume and an unequal temperature of cold air is delivered equally to each one of the electronic components, or a sufficient volume and temperature of cold air is delivered unequally to each one of the electronic components 18 because the cold air is moving too fast.

The cooling capabilities of these prior devices and systems are uneven and inadequate. In all such prior art cooling systems, because the volumetric flow is very high and the space between the front panel 12A [the incoming side, or any side panel] and the equipment vents 19 is so small, the incoming cold air at the uppermost regions of the rack enclosure 10 is not nearly as cold as the air below nor is the volume or pressure the same. Consequently, an unacceptable and uneven cooling process results.

Referring now to FIG. 2, the rack panel 20 of the present disclosure and the method associated therewith provide for a virtually even distribution of cold temperatures to each one of the electronic components 18 within the rack enclosure 10. For greater administrative clarity, the rack panel 20 is shown in relation to the other side and rear panels 12B, 12D, and 12C, respectively but without the frame of the rack enclosure 10. The rack panel 20 is an enclosed panel having a hollow interior and is adapted to replace any one or more of the side panels 12B, D or the front panel 12A of the prior art rack enclosures 10 as described and illustrated in FIG. 1A.

The rack panel 20 has at least a first wall 21, a second wall 22, two end walls 31, 32 each respectively connected the first wall 21 and to the second wall 22 thereby forming the hollow interior, and a top 25. The bottom of the rack panel 20 has a bottom wall 35 to thereby fully enclose the rack panel 20 defining a fully enclosed inner hollow chamber within. An air intake duct 26 at or near to the bottom of the rack panel 20 permits entry of cold air into the hollow chamber. The cold air is circulated and ducted through this hollow chamber up to and through the electronic equipments 18. The size of the hollow chamber allows for large amounts of cold air to move at low velocity and thereby more evenly.

The cold air is directed by one or more high pressure air moving devices or fans 17 and into the air intake duct 26 on the rack panel 20 in the direction of Arrow A. To more evenly distribute the cold air such that each one of the many electronic components 18 within the rack enclosure 10 receive virtually the same volume and degree of cold air, the hollow chamber is divided into two separate ducts 23, 24 by an inner wall 30 which has a plurality of apertures 27 to permit air to circulate from the first duct 23 into the second duct 24 in the direction of Arrow B.

The cold air will circulate through the first duct 23 and into the second duct 24 passing through the apertures 27 of the screen-like inner wall 30 in the direction of Arrows B and C. Such passage through these apertures 27 evens the pressure and flow of the cold air all along the length of the rack panel 20 which may run from the bottom 35 of the rack panel 20 up to the top wall 25. This cold air is evenly distributed through the long narrow second duct 24 and vented to the electronic equipment 18 via the discharge vents/outlets 28 in the directions of Arrows C and D. This configuration and method of more directly forcing high volumes of cold air towards the heat load and mixing it with ambient air permits delivery of large volumetric flows along a narrow exhaust vent.

Without the screen-like inner wall 30 there of course would be a single duct and the cold air within would be moving rapidly and with uneven pressure throughout the length of the single duct. With the screen-like inner wall 30, the top wall 25, and the bottom wall 35, the forced-in cold air will then be forced to turn 90° to face and move toward and through the apertures 27 of the inner wall 30 [balancing screen]. As the cold air passes through the inner wall 30, its pressure and volumetric airflow will be evened out and thereby become more even throughout the length of the second duct 24.

Once inside the second duct 24, with no other outlet except for the plurality of discharge outlets 28 on the first wall 21 situated between the inner wall 30 and the first end wall 31, the evenly dispersed cold air will turn in the direction of Arrow C and out the discharge outlets 28 in the direction of Arrow D to and evenly through each electronic component in the rack enclosure 10.

The discharge outlets 28 generally should be as close as possible to the first end wall 31 and thereby will be close to the intake vents 19 of the electronic components when the rack panel 20 replaces side panels 12B, 12D of the rack enclosure 10 as illustrated in FIG. 1A. The air intake duct 26 may also have a collar 29 around its opening to facilitate the flow of cold air to its maximum extent into the hollow chamber 23, 24 of the rack panel 20.

Though the air intake duct 26 of the rack panel 20 is illustrated to be on the bottom of the panel, it may be situated at or near the top or both at the top and the bottom depending on a user's particular needs and circumstances. Regardless of point of entry, cold air will be evenly distributed through this rack panel 20 and its dual duct 23, 24 configuration and screen-like inner wall 30, 27. Typically the discharge outlets 28 should be above the air intake duct 26 if such if situated at or near the bottom, and should be below the air intake duct 26 if situated at or near the top.

This evenly distributed cold air will be delivered to each electronic component 18 through its intake vents 19 and has a greater cooling effect than prior-art devices and methods. The cold air will pass through the electronic component 18, become heated and will pass out exhaust the vents 19 of the electronic components 18, and ultimately out the rack enclosure 10 through the exhaust vents 13 which typically are on the rear panel 12C.

In other words, and using FIG. 1A as a model, the rack panel 20 of this disclosure would replace the front panel 12A of that rack enclosure 10. Cold air would be forced through the rack panel 20 of this disclosure and into and through the electronic components 18 via their respective intake and exhaust vents 19 thereby cooling the electronic equipment 18. The rear panel 12C of that rack enclosure would have exhaust vents 13 and typically the side panels 12B, 12D would not.

The cold air passing through the electronic components 18 would cool the electronic components 18 and thereby become heated. The now heated are will vent out of the electronic components 18 and be discharged from the rack enclosure 10 through the exhaust vents 13 on the rear panel 12C. Though this description discussed that only the front panel 12A was replaced by the rack panel 20 of this disclosure, a more efficient and effective means of cooling would be to replace the side panels 12B, 12D of the rack enclosure 10 with the rack panel 20 of this disclosure.

Using FIG. 1A as an example where the rack enclosure 10 has a solid front panel 12A and solid side panels 12B, 12D, with the rear panel 12C having exhaust vents 13, the side panels 12B, 12D would be removed. These side panels 12B, 12D would be replaced with the rack panel 20 of this disclosure. The rack panel 20 as illustrated in FIG. 2 would replace the left side panel 12D. The discharge outlets 28 are adjacent to the front panel 12A and thereby as close as possible to the inlet vents 19 of the electronic components 18.

A mirror-image of the rack panel 20 illustrated in FIG. 2 would be placed on the right side of the rack enclosure 10 thereby replacing side panel 12B. In this regard, the discharge outlets 28 of this rack panel 20 also are adjacent to the front panel 12A and thereby as close as possible to the inlet vents 19 of the electronic components 18. This dual approach of replacing the two side panels 12B, 12D of the rack enclosure 10 with the rack panel 20 of this disclosure provides maximum sustained cooling to the electronic components 18.

Additionally, conventional temperature sensors at the air intake duct 26 [reference character 48A] or at the rear vents 19 of the electronic components 18 [or rear side vents on the rear panel, reference character 48B] or both measure incoming air and exhaust air, respectively, to ensure quality of cooling effect. As the temperature of exhaust air rises [or falls as the case may be] such would be detected by the sensor 48B for example at or near to one or more of the exhaust vents 13.

Depending on the reading and desired cooling effect, the sensor 48 would cause the fans 17 to throttle up or down as necessary. In most efficient cooling situations, the exhaust air should not exceed 25° C. or lower. If for example the sensor 48B at the exhaust side of the rack enclosure 10 senses a pre-determined threshold as established and set by the user, an alarm signal would be sent to a controller or to the fans 17 and the fans 17 would be throttled up to direct and force more cold air into the rack panel 20 to mix with ambient air going through the electronic equipment 18.

The present disclosure includes that contained in the present claims as well as that of the foregoing description. Although this rack panel of this disclosure has been described in its preferred forms with a certain degree of particularity, it is understood that the present disclosure of the preferred form has been made only by way of example and numerous changes in the details of construction and combination and arrangement of parts and method steps may be resorted to without departing from the spirit and scope of the rack panel of this disclosure. Accordingly, the scope of the rack panel of this disclosure should be determined not by the embodiments illustrated, but by the appended claims and their legal equivalents.

Applicant[s] have attempted to disclose all the embodiments of the rack panel of this disclosure that could be reasonably foreseen. It must be understood, however, that there may be unforeseeable insubstantial modifications to rack panel of this disclosure that remain as equivalents and thereby falling within the scope of the rack panel of this disclosure.

What is claimed is:

1. A rack panel for a rack enclosure housing servers comprising:
   a first wall having a first end and a second end and a second wall having a first end and a second end;
   a first end wall attached to the first end of the first wall and to the first end of the second wall;
   a second end wall attached to the second end of the first wall and to the second end of the second wall thereby defining a hollow chamber within said first wall, said first end wall, said second wall, and said second end wall;

an inner wall having a first edge and a second edge wherein said first edge is attached to said first wall and said second edge is attached to said second wall thereby defining a first duct and a second duct within said hollow chamber; and air means for introducing air into said rack panel, circulating air through said first duct, into said second duct, and out of said rack panel.

2. The rack panel as claimed in claim 1 wherein said air means comprises an air inlet duct in the first wall.

3. The rack panel as claimed in claim 1 wherein said air means comprises an air inlet duct located at or near the bottom of the rack panel.

4. The rack panel as claimed in claim 1 wherein said air means comprises an air inlet duct located at or near the top of the rack panel.

5. The rack panel as claimed in claim 2 wherein said air means comprises one or more air movers adjacent to said air inlet duct.

6. The rack panel as claimed in claim 1 wherein said air means comprises a plurality of apertures in said inner wall.

7. The rack panel as claimed in claim 1 wherein said air means comprises a plurality of outlets on said first wall between said first end wall and said inner wall.

8. A rack enclosure for housing servers comprising:
a front panel having a first wall with a first end and a second end and a second wall having a first end and a second end, a first end wall attached to the first end of the first wall and to the first end of the second wall, a second end wall attached to the second end of the first wall and to the second end of the second wall thereby defining a hollow chamber within said first wall, said first end wall, said second wall, and said second end wall, an inner wall having a first edge and a second edge wherein said first edge is attached to said first wall and said second edge is attached to said second wall thereby defining a first duct and a second duct within said hollow chamber;

a rear panel having a plurality of exhaust vents;

side panels adjacent to said front panel and to said rear panel; and air means for introducing air into said front panel, circulating air through said first duct, into said second duct, and out of said front panel and through said exhaust vents on said rear panel.

9. The rack enclosure as claimed in claim 8 wherein said air means comprises an air inlet duct in the first wall.

10. The rack enclosure as claimed in claim 8 wherein said air means comprises an air inlet duct located at or near the bottom of the front panel.

11. The rack enclosure as claimed in claim 8 wherein said air means comprises an air inlet duct located at or near the top of the front panel.

12. The rack enclosure as claimed in claim 9 wherein said air means comprises one or more air movers adjacent to said air inlet duct.

13. The rack enclosure as claimed in claim 8 wherein said air means comprises a plurality of apertures in said inner wall.

14. The rack enclosure as claimed in claim 8 wherein said air means comprises a plurality of outlets on said first wall between said first end wall and said inner wall.

15. The rack enclosure as claimed in claim 8 further comprising sensor means for sensing air temperature at said plurality of exhaust vents.

16. A rack enclosure for housing servers comprising:
one or more rack panels, each of said one or more rack having a first wall with a first end and a second end and a second wall panels having a first end and a second end, a first end wall attached to the first end of the first wall and to the first end of the second wall, a second end wall attached to the second end of the first wall and to the second end of the second wall thereby defining a hollow chamber within said first wall, said first end wall, said second wall, and said second end wall, an inner wall having a first edge and a second edge wherein said first edge is attached to said first wall and said second edge is attached to said second wall thereby defining a first duct and a second duct within said hollow chamber;

a rear panel having a plurality of exhaust vents, said rear panel adjacent to the second end wall of at least two of the said one or more rack panels;

a front panel adjacent to the first end wall of at least two of the said one or more rack panels; and air means for introducing air into said one or more rack panels, circulating air through said first duct, into said second duct, and out of said front panel and through said exhaust vents on said rear panel.

17. The rack enclosure as claimed in claim 16 wherein said air means comprises an air inlet duct in the first wall of each of the said one or more rack panels.

18. The rack enclosure as claimed in claim 17 wherein said air inlet duct is located at or near the bottom of each of the said one or more rack panels.

19. The rack enclosure as claimed in claim 17 wherein said air inlet duct is located at or near the top of each of the said one or more rack panels.

20. The rack enclosure as claimed in claim 17 wherein said air means comprises one or more air movers adjacent to said air inlet duct of each of the said one or more rack panels.

21. The rack enclosure as claimed in claim 16 wherein said air means comprises a plurality of apertures in said inner wall of each of the said one or more rack panels.

22. The rack enclosure as claimed in claim 16 wherein said air means comprises a plurality of outlets on said first wall between said first end wall and said inner wall of each of the said one or more rack panels.

23. The rack enclosure as claimed in claim 16 further comprising sensor means for sensing air temperature at said plurality of exhaust vents.

* * * * *